(12) United States Patent
Chang et al.

(10) Patent No.: US 11,887,851 B2
(45) Date of Patent: Jan. 30, 2024

(54) METHOD FOR FORMING AND USING MASK

(71) Applicant: Taiwan Semiconductor Manufacturing Co., Ltd., Hsinchu (TW)

(72) Inventors: Ching-Yu Chang, Taipei (TW); Jei Ming Chen, Tainan (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 250 days.

(21) Appl. No.: 17/388,209

(22) Filed: Jul. 29, 2021

(65) Prior Publication Data
US 2023/0032703 A1 Feb. 2, 2023

(51) Int. Cl.
*H01L 21/033* (2006.01)
*H01L 21/768* (2006.01)
*H01L 21/311* (2006.01)

(52) U.S. Cl.
CPC .... *H01L 21/0337* (2013.01); *H01L 21/31144* (2013.01); *H01L 21/76802* (2013.01); *H01L 21/76877* (2013.01)

(58) Field of Classification Search
CPC ........... H01L 21/0337; H01L 21/31144; H01L 21/76802; H01L 21/76877; H01L 21/31058; H01L 21/0273; H01L 21/0332; H01L 21/76831

USPC ......................................................... 438/672
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,184,054 B1 | 11/2015 | Huang et al. | |
| 9,213,234 B2 | 12/2015 | Chang | |
| 9,223,220 B2 | 12/2015 | Chang | |
| 9,256,123 B2 | 2/2016 | Shih et al. | |
| 9,256,133 B2 | 2/2016 | Chang | |
| 9,529,268 B2 | 12/2016 | Chang et al. | |
| 9,536,759 B2 | 1/2017 | Yang et al. | |
| 9,548,303 B2 | 1/2017 | Lee et al. | |
| 10,978,301 B2 | 4/2021 | Chang et al. | |
| 2006/0205220 A1* | 9/2006 | Hudson | H01L 21/32139 257/E21.256 |
| 2020/0075319 A1* | 3/2020 | Chang | H01L 21/0273 |
| 2020/0373154 A1 | 11/2020 | Li et al. | |
| 2021/0066121 A1 | 3/2021 | Peng et al. | |

* cited by examiner

*Primary Examiner* — Caleen O Sullivan
(74) *Attorney, Agent, or Firm* — Slater Matsil, LLP

(57) ABSTRACT

A method of forming a semiconductor device includes forming a photoresist layer over a mask layer, patterning the photoresist layer, and forming an oxide layer on exposed surfaces of the patterned photoresist layer. The mask layer is patterned using the patterned photoresist layer as a mask. A target layer is patterned using the patterned mask layer as a mask.

20 Claims, 10 Drawing Sheets

METHOD FOR FORMING AND USING MASK

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
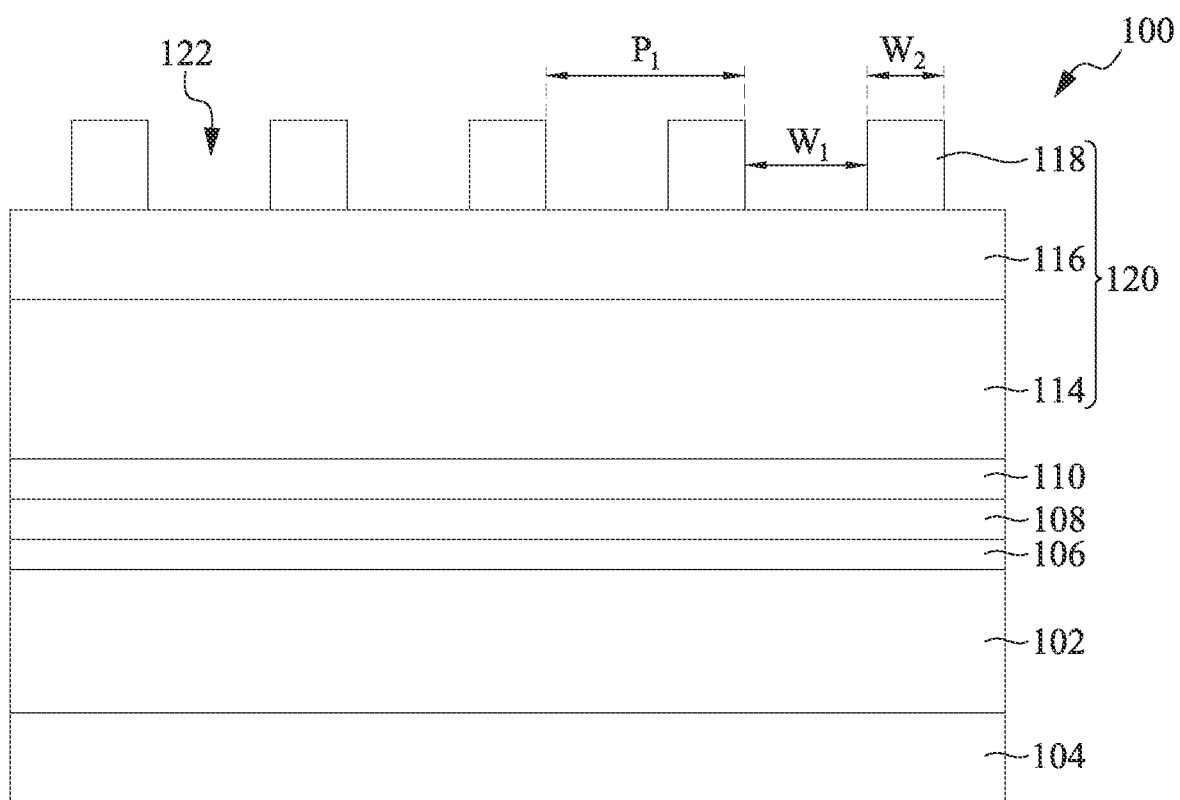
FIG. 1 illustrates a cross-sectional view of an intermediary stage of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method are provided in accordance with some embodiments. In particular, methods of protecting a profile of a patterned photoresist layer are provided, including treating the photoresist with a treatment process (e.g., a plasma treatment) and forming a film over the photoresist. Protecting the profile of the patterned photoresist layer can lead to a transfer of the pattern of the patterned photoresist to lower layers with reduced defects, which may reduce line width roughness (LWR) of subsequently formed conductive features in a target layer, such as metal lines. Smoother profiles of the conductive features may decrease sheet resistance and thus improve device performance.

FIGS. 1 through 8 illustrate cross-sectional views of intermediate stages in the formation of features in a target layer 102 on a semiconductor device 100, in accordance with various embodiments. The target layer 102 is a layer in which a plurality of patterns is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions of the wafer in order to separate individual semiconductor dies from the wafer (also referred to as singulation).

In some embodiments, the target layer 102 is an inter-metal dielectric (IMD) layer. In such embodiments, the target layer 102 comprises a low-k dielectric material having a dielectric constant (k value) lower than 3.8, lower than 3.0, or lower than 2.5, for example. In some embodiments, target layer 102 is an IMD layer comprising high-k dielectric material having a k value higher than 3.8. Openings may be patterned in the target layer 102 with the embodiment processes, and conductive lines and/or vias may be formed in the openings as described below.

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process to define semiconductor fins, and subsequent process steps may be used to form shallow trench isolation (STI) regions in the substrate. The semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs), nanostructure field effect transistors (nano-FETs), or the like.

In some embodiments, the target layer 102 is a conductive layer, such as a metal layer or a polysilicon layer, which is blanket deposited. Embodiment patterning processes may be applied to the target layer 102 in order to pattern semiconductor gates and/or dummy gates of transistors (e.g., finFETs, nano-FETs, or the like). By using embodiment processes to pattern a conductive target layer 102, spacing between adjacent gates may be reduced and gate density may be increased.

In FIG. 1, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 104. In other embodiments where the target layer 102 is a semiconductor substrate used to form finFETs, the semiconductor substrate 104 may be omitted.

Although FIG. 1 illustrates target layer 102 being in physical contact with semiconductor substrate 104, any number of intervening layers may be disposed between target layer 102 and semiconductor substrate 104. Such intervening layers may include an inter-layer dielectric (ILD) layer comprising a low-k dielectric and having contact plugs formed therein, other IMD layers having conductive lines and/or vias formed therein, one or more intermediary layers (e.g., etch stop layers, adhesion layers, etc.), combinations thereof, and the like. For example, an optional etch stop layer (not illustrated) may be disposed directly under the target layer 102. The etch stop layer may act as a stop for an etching process subsequently performed on the target layer 102. The material and process used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), plasma vapor deposition (PVD), or the like.

The film stack further includes an anti-reflective coating (ARC) 106 formed over the target layer 102. The ARC 106 aids in the exposure and focus of overlying photoresist layers (discussed below) during patterning of the photoresist layers. In some embodiments, the ARC 106 may be formed from SiON, silicon carbide, materials doped with oxygen (O) and nitrogen (N), or the like. In some embodiments, the ARC 106 is substantially free from nitrogen, and may be formed from an oxide. In such embodiments, the ARC 106 may be also referred to as a nitrogen-free ARC (NFARC). The ARC 106 may be formed by Plasma Enhance Chemical Vapor Deposition (PECVD), High-Density Plasma (HDP) deposition, or the like.

The film stack further includes a hard mask layer 108 formed over the ARC 106 and the target layer 102. The hard mask layer 108 may be formed of a material that comprises a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like), and may be formed by PVD, Radio Frequency PVD (RFPVD), CVD, Atomic Layer Deposition (ALD), or the like. In subsequent processing steps, a pattern is formed on the hard mask layer 108 using an embodiment patterning process. The hard mask layer 108 is then used as an etching mask for etching the target layer 102, where the pattern of the hard mask layer 108 is transferred to the target layer 102.

The film stack further includes a dielectric layer 110 formed over the hard mask layer 108. The dielectric layer 110 may be a silicon oxide, and may be formed from borophosphosilicate tetraethylortho silicate (BPTEOS) or undoped tetraethylorthosilicate (TEOS), or formed by CVD, ALD, spin-on coating, or the like. In some embodiments, the dielectric layer 110 acts as an etch stop layer for patterning a bottom layer of a bi-layer or tri-layer photoresist mask. In some embodiments, the dielectric layer 110 also acts as an anti-reflective coating.

A tri-layer photoresist 120 is formed on the film stack over the dielectric layer 110. The tri-layer photoresist 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which include organic materials. In some embodiments, the upper layer 118 is a material comprising carbon such as an organic material, e.g. diazonaphthoquinone, novolac resins, Bisphenol A novolac epoxy, off-stoichiometry thiol-enes (OSTE) polymer, the like, or a combination thereof. In some embodiments, the bottom layer 114 may also be a bottom anti-reflective coating (BARC) layer.

The middle layer 116 may comprise an inorganic material, which may be a nitride (such as silicon nitride), an oxynitride (such as silicon oxynitride), an oxide (such as silicon oxide), combinations of these or the like. The middle layer 116 may have a high etching selectivity relative to the upper layer 118 (after modification as described below) and the bottom layer 114. The various layers of the tri-layer photoresist 120 may be blanket deposited sequentially using, for example, spin-on processes. Other suitable deposition process may be used, such as CVD, ALD, PVD, or the like.

Although a tri-layer photoresist 120 is discussed, in some embodiments, the photoresist 120 may be a monolayer or a bilayer (e.g., comprising only the bottom layer 114 and the upper layer 118 without the middle layer 116) photoresist. The type of photoresist used (e.g., monolayer, bilayer, or tri-layer) may depend on the photolithography process used to pattern the target layer 102 or mandrel/spacer layer overlying the dielectric layer 110.

The upper layer 118 is patterned using a photolithographic process, as discussed in greater detail below. Subsequently, the upper layer 118 is used as an etching mask for patterning of the middle layer 116 (see e.g., FIG. 4). The middle layer 116 is then used as an etching mask for patterning of the bottom layer 114 (see e.g., FIG. 5). The bottom layer 114 is then used to pattern the dielectric layer 110 and the hard mask layer 108 (see FIGS. 6-7), the hard mask layer 108 is then used to pattern the ARC 106 (see FIG. 8) and the target layer 102 (see FIG. 9).

The upper layer 118 is patterned using any suitable photolithography process to form openings 122 therein. To achieve narrow line widths directly in a single patterning process, EUV may be used as a light source in the photolithography process. As an example of patterning openings 122 in the upper layer 118, a photomask (not shown) may be disposed between a radiation beam and the upper layer 118. The upper layer 118 may then be exposed to the radiation beam. In some embodiments, the radiation beam may include an radiation source, such as EUV, an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the upper layer 118 may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used.

The openings 122 may have strip shapes in a plan view (not illustrated). The pitch $P_1$ of the openings 122 may be the minimum pitch achievable using photolithographic processes alone. For example, in some embodiments, the pitch $P_1$ of the openings 122 is in a range of 30 nm and 100 nm. Other pitches $P_1$ of the openings 122 are also contemplated. The width $W_1$ of the openings 122 may in a range of 15 nm and 50 nm, and the width $W_2$ of discrete remaining portions of the upper layer 118 may be in a range of 15 nm and 50 nm. Other values of $W_1$ and $W_2$ are also contemplated.

Figure 2:
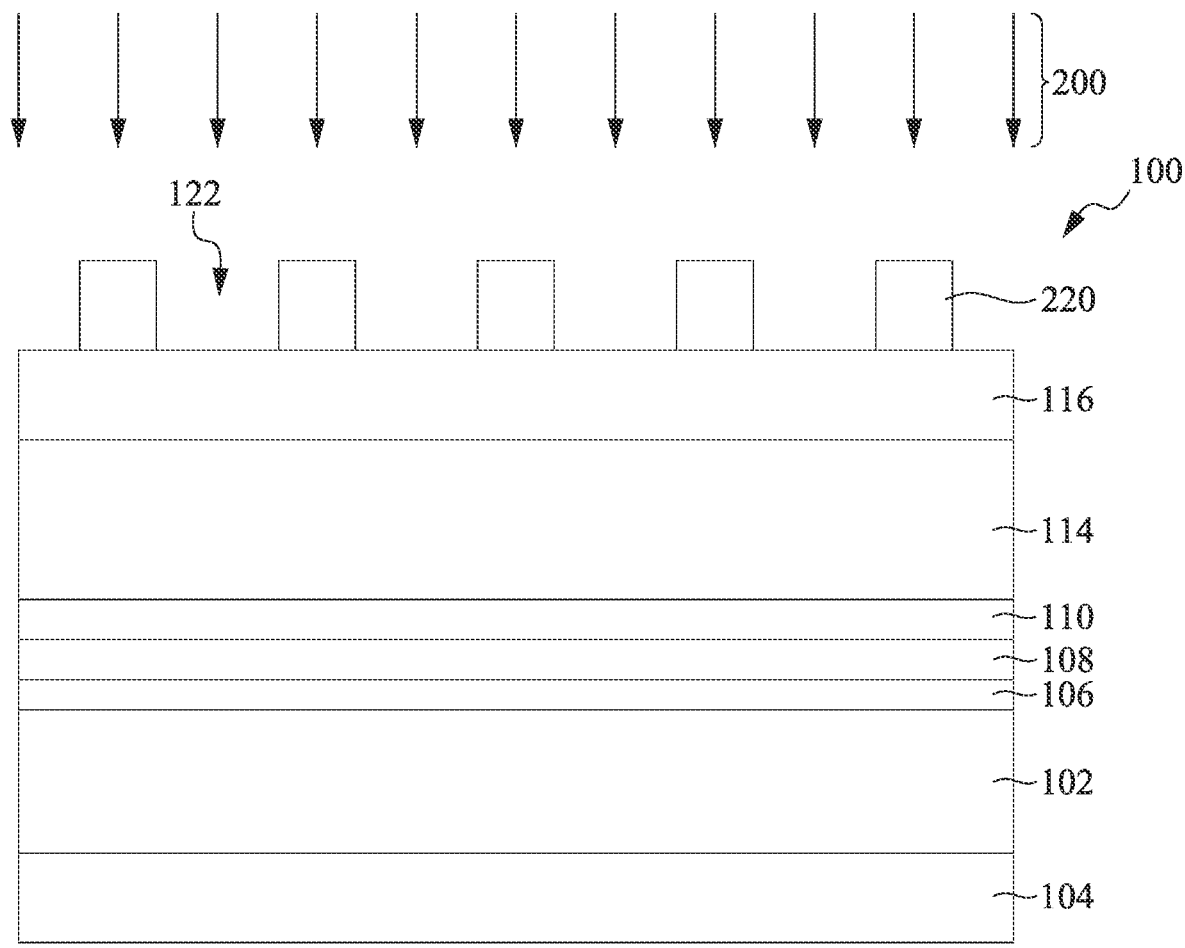
FIGS. 2-8 illustrate cross-sectional views of various intermediary stages of manufacturing a semiconductor device in accordance with some embodiments.

In FIG. 2, the upper layer 118 is treated with a treatment process 200, which converts the upper layer 118 to a treated upper layer 220. The treatment process 200 may lead to a reduction in line width roughness (LWR) of subsequently formed conductive features in the target layer 102 (see below, FIGS. 9-10), such as metal lines. Resulting smoother line profiles may improve device performance, such as by decreasing sheet resistance. In some embodiments, a de-scum process (as described below in, e.g., FIG. 3) may be performed prior to the treatment process 200.

In some embodiments, the treatment process 200 is a plasma treatment, such as with an $O_2$ plasma. The $O_2$ plasma may react with the organic photoresist material of the upper layer 118, converting the upper layer 118 to the treated upper layer 220. In some embodiments, the modification of the upper layer 118 to the treated upper layer 220 is an oxidation of the carbon-containing exposed surfaces of the upper layer 118. The oxidation of the edges and profile of the treated upper layer 220 may modify bonds on the exposed surfaces of the treated upper layer 220 and provide improved etching selectivity with the material of the middle layer 116 compared to the untreated upper layer 118, which may improve the etching of the middle layer 116 in a subsequent step (see below, FIG. 4). This may lead to reduced LWR of subsequently formed conductive features in the target layer 102.

The treatment process 200 may be performed at a temperature less than 200° C., such as in a range of 70° C. to 200° C., which is advantageous for improving etching selectivity of the treated upper layer 220 with respect to the middle layer 116. Performing the treatment process 200 at a temperature less than 70° C. may be disadvantageous by decreasing efficiency of the plasma treatment, which may lead to worse etching selectivity of the treated upper layer 220 with the middle layer 116. Performing the treatment process 200 at a temperature greater than 200° C. may be disadvantageous by damaging the profile of the treated upper layer 220, which may lead to increased LWR of subsequently formed conductive features in the target layer 102.

The treatment process 200 may be performed for a duration in a range of 1 second to 10 seconds, which is advantageous for improving etching selectivity of the treated upper layer 220 with the middle layer 116. Performing the treatment process 200 for less than 1 second may be disadvantageous by decreasing efficiency of the plasma treatment, which may lead to worse etching selectivity of the treated upper layer 220 with the middle layer 116. Performing the treatment process 200 for more than 10 seconds may be disadvantageous by damaging the profile of the treated upper layer 220, which may lead to increased LWR of subsequently formed conductive features in the target layer 102.

Figure 3:
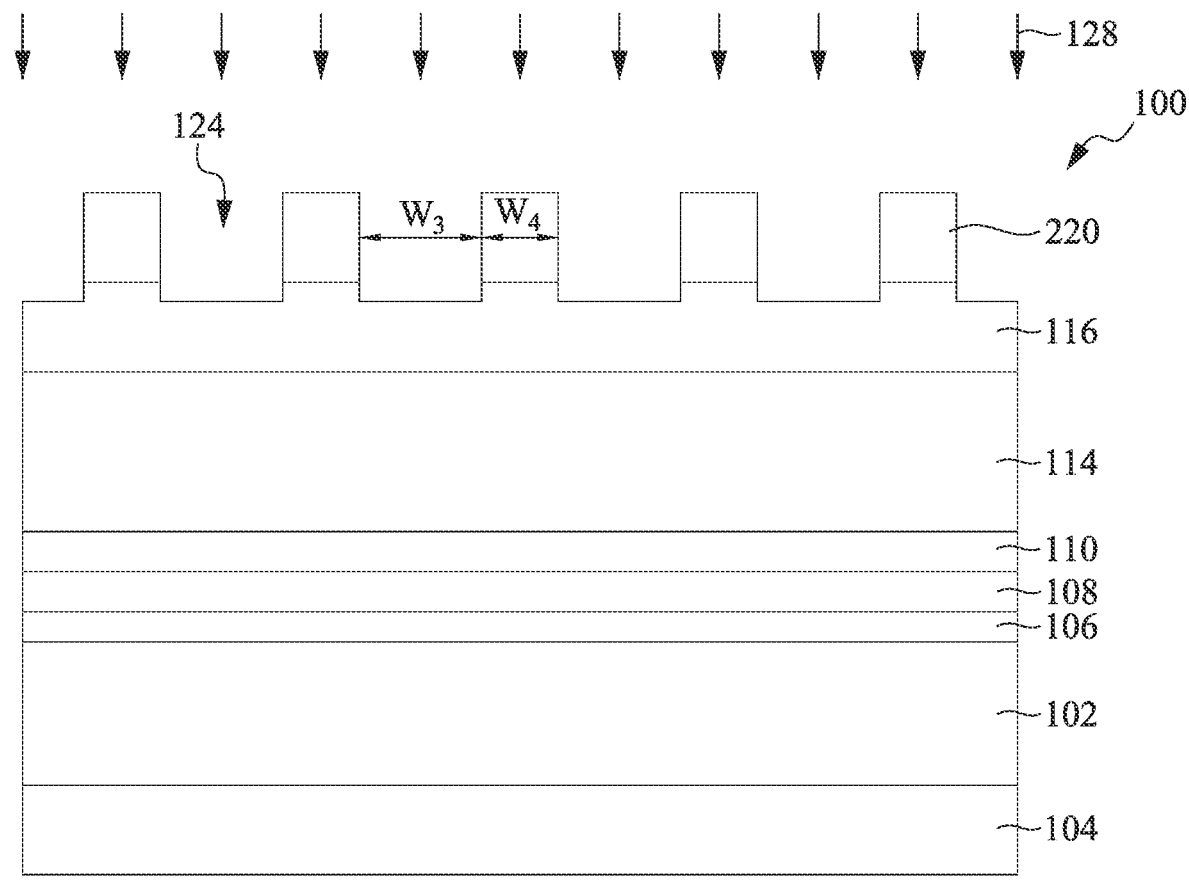

FIG. 3 illustrates a de-scum process 128 on the semiconductor device 100 after the patterning of the upper layer 118 as illustrated in FIG. 1. The de-scum process 128 uniformly removes a small amount of material from the exposed parts of the treated upper layer 220 and middle layer 116. The de-scum process 128 provides vertical resist profiles of the treated upper layer 220 and removes residue of the treated upper layer 220 which remain in openings 122 after patterning. The de-scum process may use a wet or dry etch process to facilitate the removal of material of the treated upper layer 220 and middle layer 116. Suitable chemical etchants for a wet de-scum process include tetramethylammonium hydroxide (TMAH), sulfuric acid ($H_2SO_4$), potassium hydroxide (KOH), boron hydroxide (BOH), other suitable acids or hydroxides, or combinations thereof. Suitable process gasses for a dry de-scum process include oxygen, a fluorine containing gas, a chlorine containing gas, an $O_2$ based gas, or combinations thereof. The de-scum process 128 may comprise one or more process steps. As a result of the de-scum process 128, openings 122 are enlarged into openings 124. The width $W_3$ of the openings 124 may be in a range of 16 nm and 53 nm. Correspondingly, the width $W_4$ of portions of the treated upper layer 220 at its narrowest points may be in a range of 12 nm and 49 nm Although FIGS. 2 and 3 describe the de-scum process 128 being performed after the treatment process 200, in other embodiments, the de-scum process 128 may be performed prior to the treatment process 200.

Figure 4:
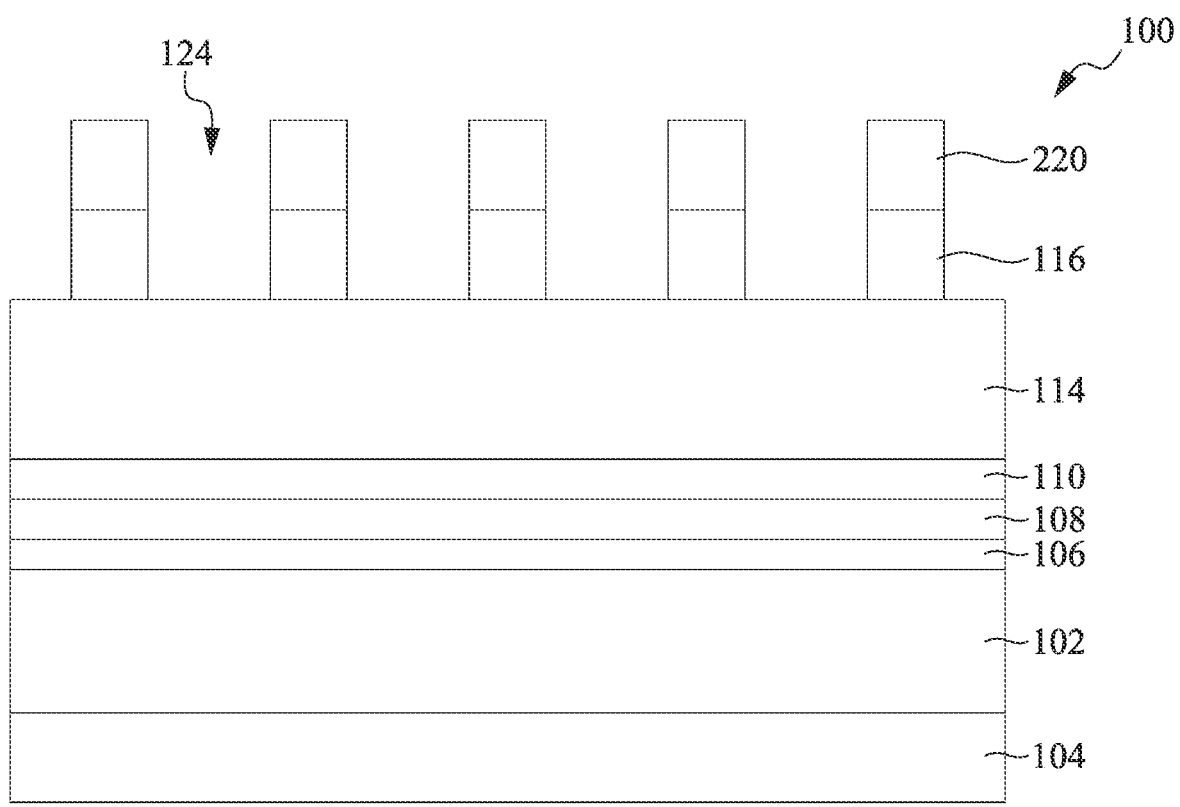

After the patterning of the upper layer 118, the treatment process 200, and the de-scum process 128, FIG. 4 illustrates the transferring of the pattern of the treated upper layer 220 after conversion to the middle layer 116 in an etching process. The etching process is anisotropic, so that the openings 124 are extended through the middle layer 116 and have about the same sizes in the middle layer 116 as they do in the overlying layer. The oxidized top surfaces and sidewalls of the treated upper layer 220 may be resistant to damage from the etching process, which may reduce the amount of the treated upper layer 220 consumed by the etching process. Because sufficient amounts of the treated upper layer 220 are not consumed by the etching process, the pattern of the treated upper layer 220 is transferred to the middle layer 116 by the etching process with fewer defects. The pattern of the middle layer 116 having fewer defects may lead to reduced roughness of the sidewalls of the openings 124 and improved subsequent transfer of the pattern to lower layers, which may reduce LWR of subsequently formed conductive features in the target layer 102.

Figure 5:
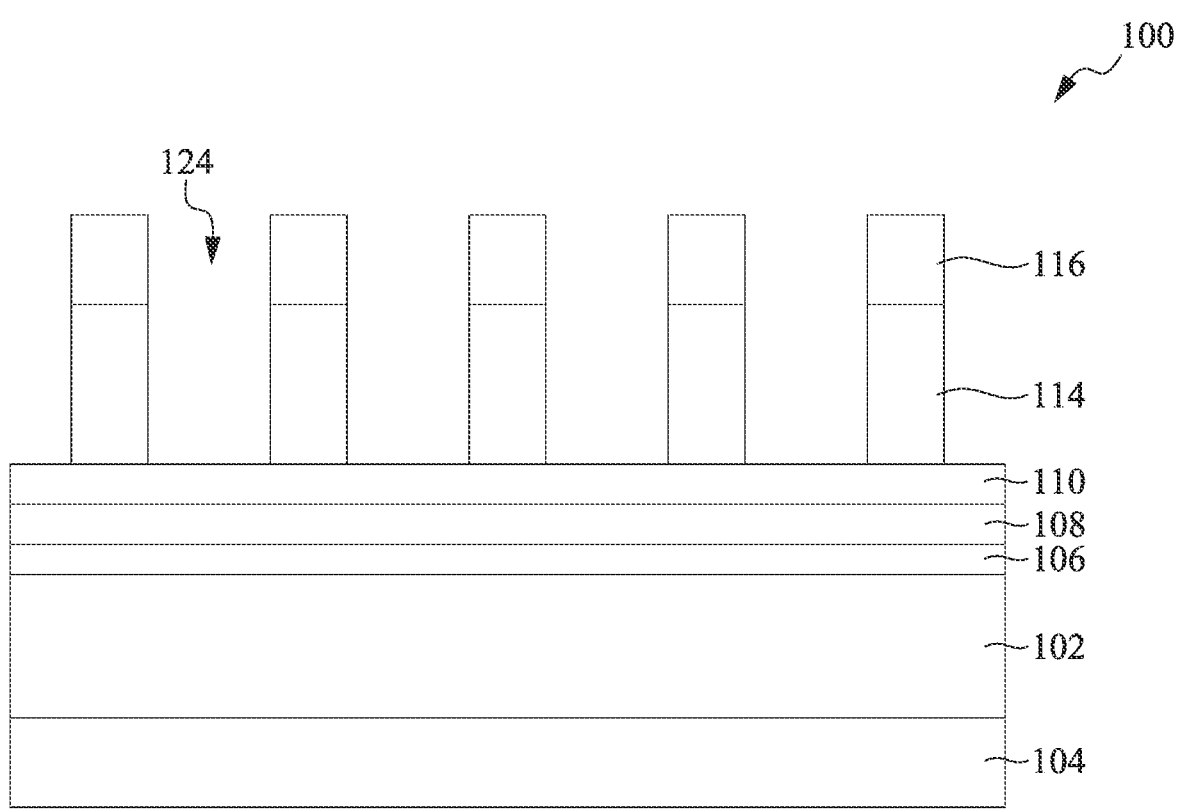

In FIG. 5, an etching process is performed to transfer the pattern of the middle layer 116 to the bottom layer 114, thereby extending the openings 124 through the bottom layer 114. The etching process of the bottom layer 114 is anisotropic, so that the openings 124 in the middle layer 116 are extended through the bottom layer 114 and have about the same sizes in the bottom layer 114 as they do in the middle layer 116. The oxidized top surfaces and sidewalls of the treated upper layer 220 may reduce the amount of the treated upper layer 220 consumed while transferring the pattern of the treated upper layer 220 to the middle layer 116, which may reduce roughness of the sidewalls of the openings 124 and transfer the pattern of the middle layer 116 to the bottom layer 114 with fewer defects. The pattern of the bottom layer 114 having fewer defects may lead to improved subsequent transfer of the pattern to lower layers, which may reduce LWR of subsequently formed conductive features in the target layer 102. As part of etching the bottom layer 114, remaining portions of the treated upper layer 220 may be consumed. In some embodiments, remaining portions of the treated upper layer 220 are removed by a separate process prior to or after the etching of the bottom layer 114.

Figure 6:
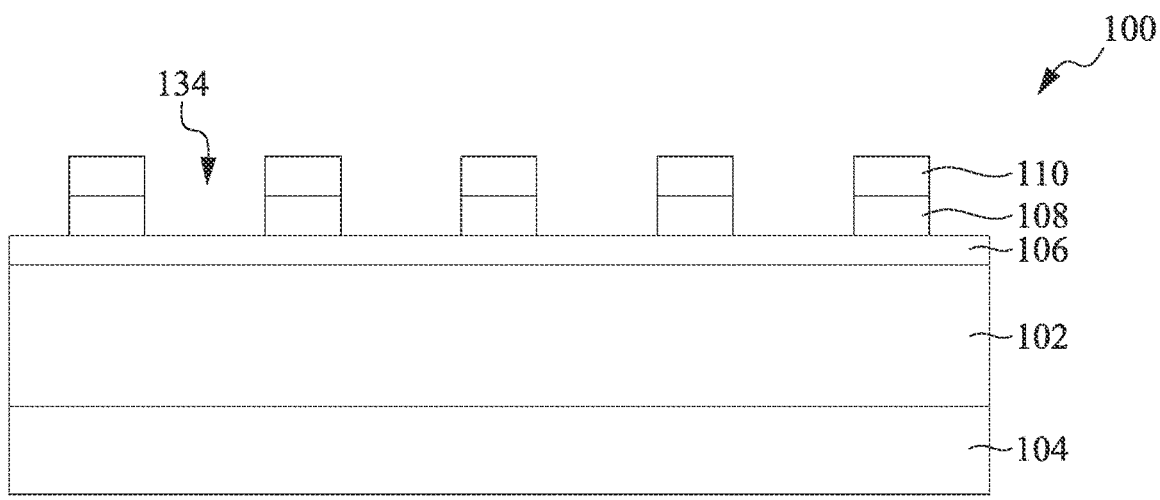
Figure 7:
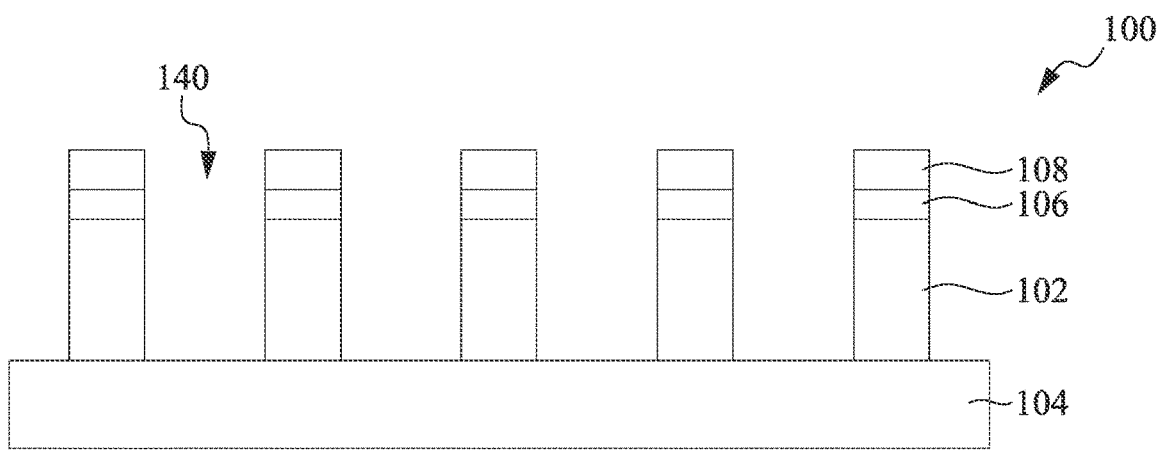
Figure 8:
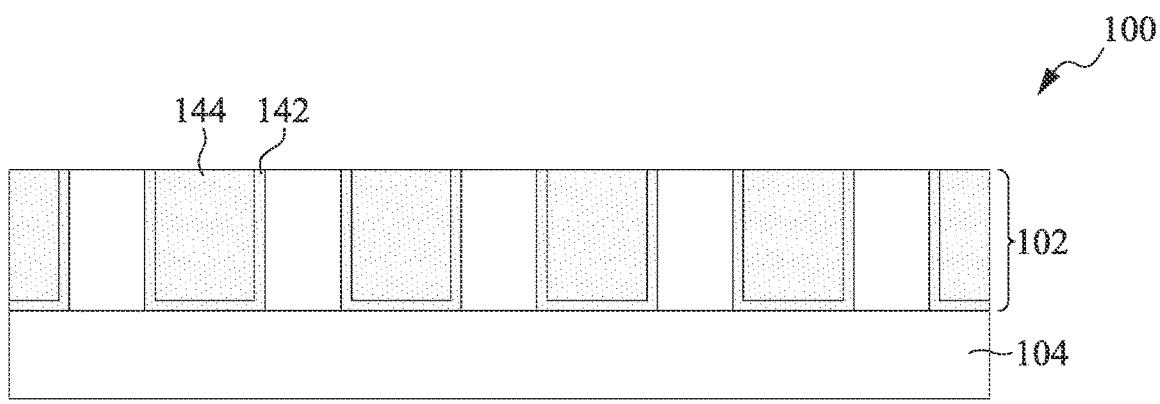
Figure 9:
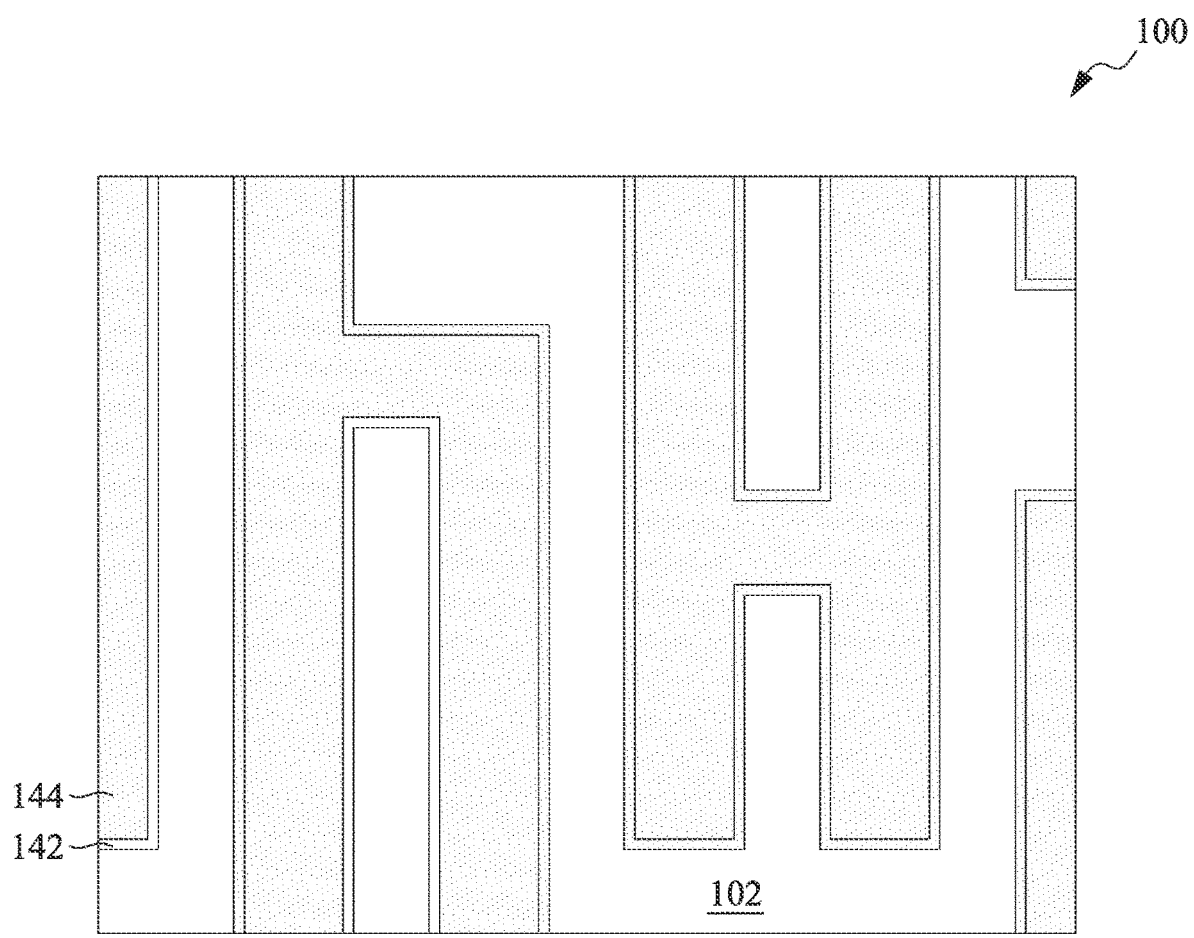
FIG. 9 illustrates a top down view of an intermediary stage of manufacturing a semiconductor device in accordance with some embodiments.

FIGS. 6 and 7 illustrate the continuing patterning of subsequent layers down to the target layer 102 by transferring the pattern in overlying layers to the underlying layers. FIG. 8 illustrates depositing features in the target layer 102. FIG. 9 is a plan view following the depositing of features in the target layer 102.

In FIG. 6, the pattern of the bottom layer 114 is transferred to the dielectric layer 110 and the hard mask layer 108 using an etching process, forming openings 134 through the dielectric layer 110 and the hard mask layer 108. The etching process of the dielectric layer 110 and the hard mask layer 108 is anisotropic, so that the openings 124 in the bottom layer 114 (see above, FIG. 5) are extended through the dielectric layer 110 and the hard mask layer 108, and so that the openings 134 have about the same sizes in the dielectric layer 110 as the openings 124 in the bottom layer 114. The oxidized top surfaces and sidewalls of the treated upper layer 220 may reduce the amount of the treated upper layer 220 consumed while transferring the pattern of the treated upper layer 220 to the middle layer 116, which may lead to a transfer of the pattern to the bottom layer 114 with fewer defects and reduced roughness of the sidewalls of the openings 124. As the pattern of the bottom layer 114 has reduced defects, the transfer of the pattern to the dielectric layer 110 and the hard mask layer 108 may produce fewer defects and lead to reduced roughness of the sidewalls of the openings 134, which may further lead to reduced LWR of subsequently formed conductive features in the target layer 102. During etching the dielectric layer 110 and the hard mask layer 108, the middle layer 116 is consumed, and the bottom layer 114 may be at least partially consumed. In embodiments when the bottom layer 114 is not completely consumed while etching the dielectric layer 110, an ashing process may be performed to remove remaining residue of the bottom layer 114.

In FIG. 7, the ARC 106 and target layer 102 are sequentially etched using the hard mask layer 108 as an etching mask to extend openings 134 into the target layer 102 to create openings 140. The oxidized top surfaces and sidewalls of the treated upper layer 220 (see above, FIG. 2) may lead to a transfer of the pattern of the treated upper layer 220 to the hard mask layer 108 with reduced defects and reduced roughness of the sidewalls of the openings 134. This may lead to a transfer of the pattern to the target layer 102 with fewer defects, reduced roughness of the sidewalls of the openings 140 in the target layer 102, and reduced LWR of subsequently formed conductive features in the openings 140. Prior to etching the ARC 106 and the target layer 102, a wet cleaning may be performed to remove any remaining portions of the dielectric layer no. Etching the target layer 102 may comprise an anisotropic dry etch process and/or a wet etch process, which sequentially etches through the ARC 106 to the target layer 102. After the openings 134 are patterned to form openings 14o, a wet cleaning may be performed to remove any remaining portions of the hard mask layer 108 and the ARC 106 (see below, FIG. 8).

In FIG. 8, after the openings 140 are patterned in the target layer 102, features may be formed in the openings 140. In an embodiment, the target layer 102 is a low-k dielectric, and the patterned target layer 102 provides an IMD for an interconnect structure. Conductive features such as copper lines, copper vias, and/or cobalt plugs may be formed in the IMD layer as illustrated by FIG. 8. Forming the conductive features may include depositing one or more liners 142 along sidewalls and a bottom surface of the openings 140 (see FIG. 7). The liners 142 may comprise TiO, TiN, TaO, TaN, or the like and may provide diffusion barrier, adhesion, and/or seed layers for the conductive feature. The liners may be deposited using any suitable process, such as PVD, CVD, ALD, and the like. The conductive features may have reduced LWR due to the oxidized top surfaces and sidewalls of the treated upper layer 220 (see above, FIG. 2) leading to the pattern of the treated upper layer 220 being transferred more cleanly to the target layer 102.

After the liners 142 are deposited, remaining portions of the opening may be filled with a conductive material 144, such as copper using, e.g., PVD, plating, or the like. The conductive material 144 may be initially deposited to overfill the openings 140 (see above, FIG. 7), and a planarization process performed to remove excess portions of the conductive material 144 over the target layer 102. Thus, conductive features may be formed in the target layer 102.

FIG. 9 illustrates a top down view of the semiconductor device 100 after the features have been formed in the target layer 102, in accordance with some embodiments. FIG. 9 is a partial view of a pattern of conductive material 144 surrounded by the target layer 102. Liners 142 may be between the target layer 102 and the conductive material 144.

Figure 10:
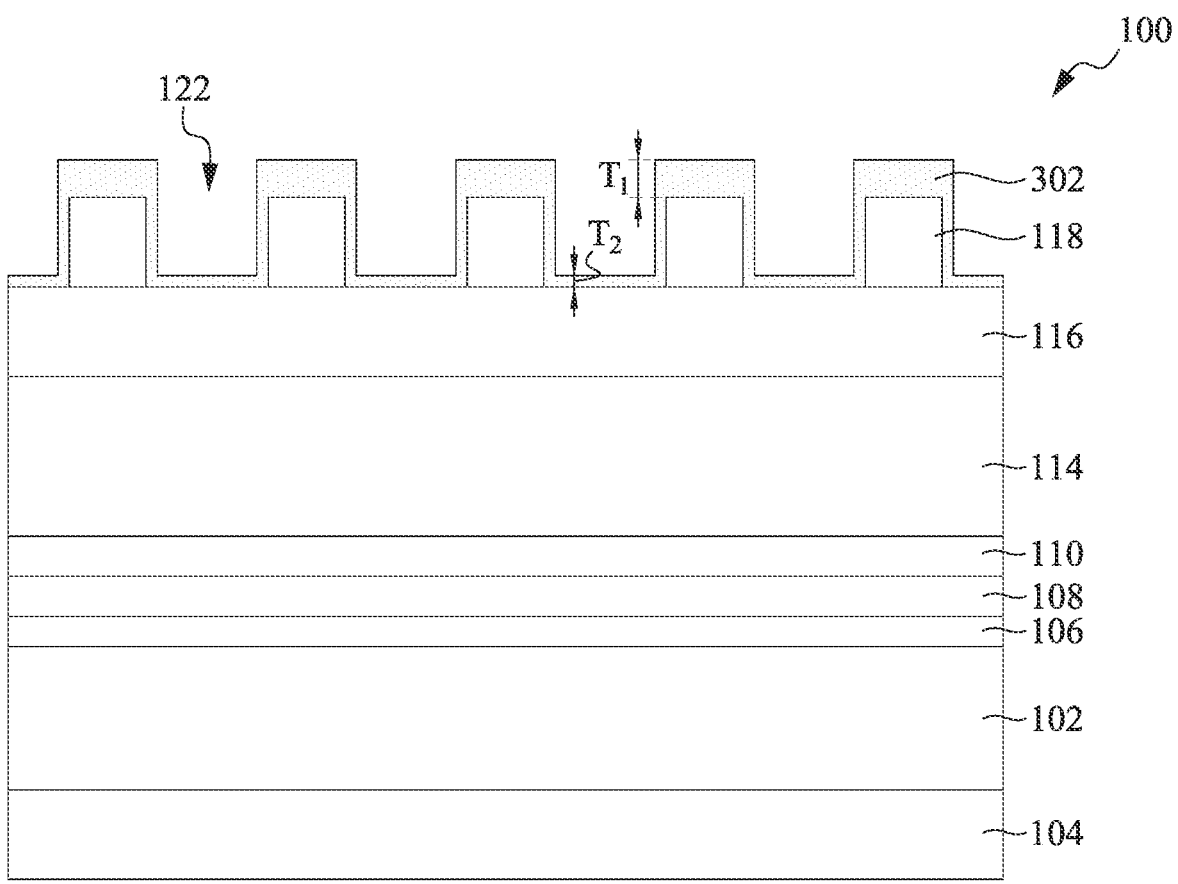
FIGS. 10-12 illustrate cross-sectional views of various intermediary stages of manufacturing a semiconductor device in accordance with some embodiments.

FIG. 10 follows from FIG. 1 and shows a film 302 formed over exposed surfaces of the top layer 118 and the middle layer 116. In some embodiments, the film 302 is formed over a treated upper layer 220, as illustrated above in FIG. 2. The film 302 is formed to a larger thickness on top surfaces of the upper layer 118 than on exposed top surfaces of the middle layer 116 due to limitations of the deposition process and the relatively high aspect ratio of the openings 122 between portions of the patterned top layer 118. The relatively thicker portions of the film 302 on the top surfaces of the upper layer 118 protect the profile of the top layer 118 during a subsequent etching process (see below, FIG. 12), which improves etching selectivity between the top layer 118 and the middle layer 116 and reduces LWR in subsequently formed conductive features such as in the target layer 102. In some embodiments, the film 302 comprises silicon oxide, silicon nitride, silicon carbide, silicon oxycarbide, silicon oxynitride, silicon oxycarbonitride, the like, or a combination thereof. The film 302 may be formed using Atomic Layer Deposition (ALD), Plasma Enhanced Atomic Layer Deposition (PEALD), CVD, PVD, the like, or a combination thereof. In some embodiments, the film 302 is silicon oxide and is formed with PEALD using oxygen, tris(dimethylamino) silane (3DMAS), bis(tertiary-butyl-amino) silane (BTBAS), bis(diethylamino)silane (BDEAS), the like, or a combination thereof as precursor gases.

The film 302 may be formed to a thickness $T_1$ in a range of 3 Å to 30 Å on top surfaces of the upper layer 118, which is advantageous for protecting the profile of the upper layer 118 during a subsequent etching process. Forming the film 302 to a thickness less than 3 Å on top surfaces of the upper layer 118 may not protect the profile of the top layer 118 during the subsequent etching process, leading to increased LWR of subsequently formed conductive features of the target layer 102 (see above, FIG. 8). Forming the film 302 to a thickness greater than 30 Å on top surfaces of the upper layer 118 may lead to insufficient etching of the middle layer 116 during the subsequent etching process, leading to poorly formed conductive features of the target layer 102.

The film 302 may be formed to a thickness $T_2$ in a range of 5 Å to 25 Å on top surfaces of the middle layer 116. In some embodiments, a ratio of the thickness $T_1$ to the thickness $T_2$ is in a range of 1 to 1.5, which is advantageous for protecting the profile of the upper layer 118 during a subsequent etching process. Forming the film 302 with a ratio of $T_1:T_2$ less than 1 may not protect the profile of the top layer 118 during the subsequent etching process, leading to increased LWR of subsequently formed conductive features of the target layer 102 (see above, FIG. 9). Forming the film 302 with a ratio of $T_1:T_2$ greater than 1.5 may lead to insufficient etching of the middle layer 116 during the subsequent etching process, leading to poorly formed conductive features of the target layer 102.

Figure 11:
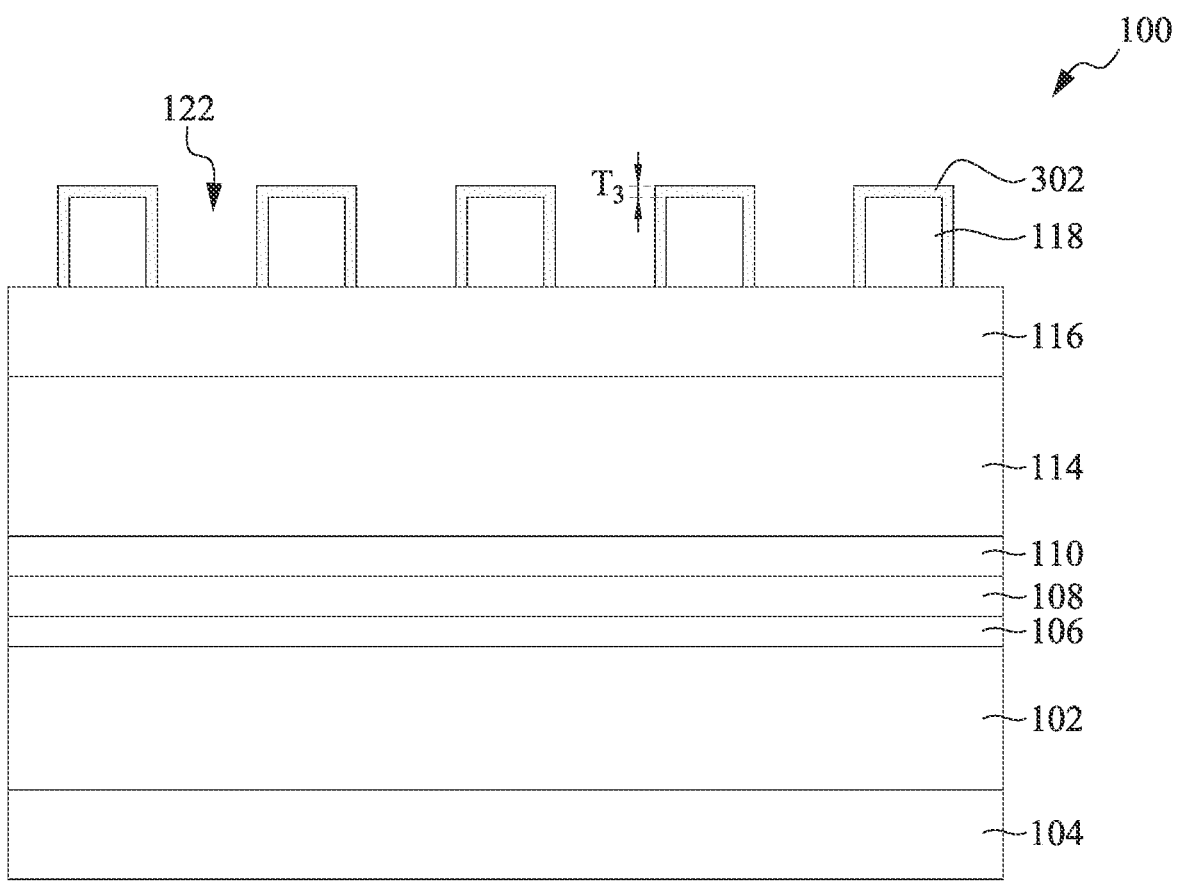

FIG. 11 follows from FIG. 10 and illustrates a thinning of the film 302 by a suitable process. The thinning of the film 302 exposes top surfaces of the middle layer 116 in preparation for a subsequent transfer of the pattern of the upper layer 118 to the middle layer 116 (see below, FIG. 12). The film 302 may be thinned by an anisotropic etch, such as a reactive ion etching (RIE) process. After the thinning process, the film 302 may cover top surfaces and sidewalls of the upper layer 118, which increases the effective height of the upper layer 118. The higher effective height of the upper layer 118 may lead to a transfer of the pattern of the upper layer 118 to the middle layer 116 with fewer defects.

The film 302 may have a thickness $T_3$ in a range of 0.1 Å to 12.5 Å on top surfaces of the upper layer 118 after the thinning process, which is advantageous for protecting the profile of the upper layer 118 during a subsequent etching process. The film 302 having a thickness less than 0.1 Å on top surfaces of the upper layer 118 after the thinning process may not protect the profile of the top layer 118 during the subsequent etching process, leading to increased LWR of subsequently formed conductive features of the target layer 102 (see above, FIG. 9). The film 302 having a thickness greater than 12.5 Å on top surfaces of the upper layer 118 after the thinning process may lead to poor pattern transfer to the middle layer 116 during the subsequent etching process, leading to poorly formed conductive features of the target layer 102.

Figure 12:
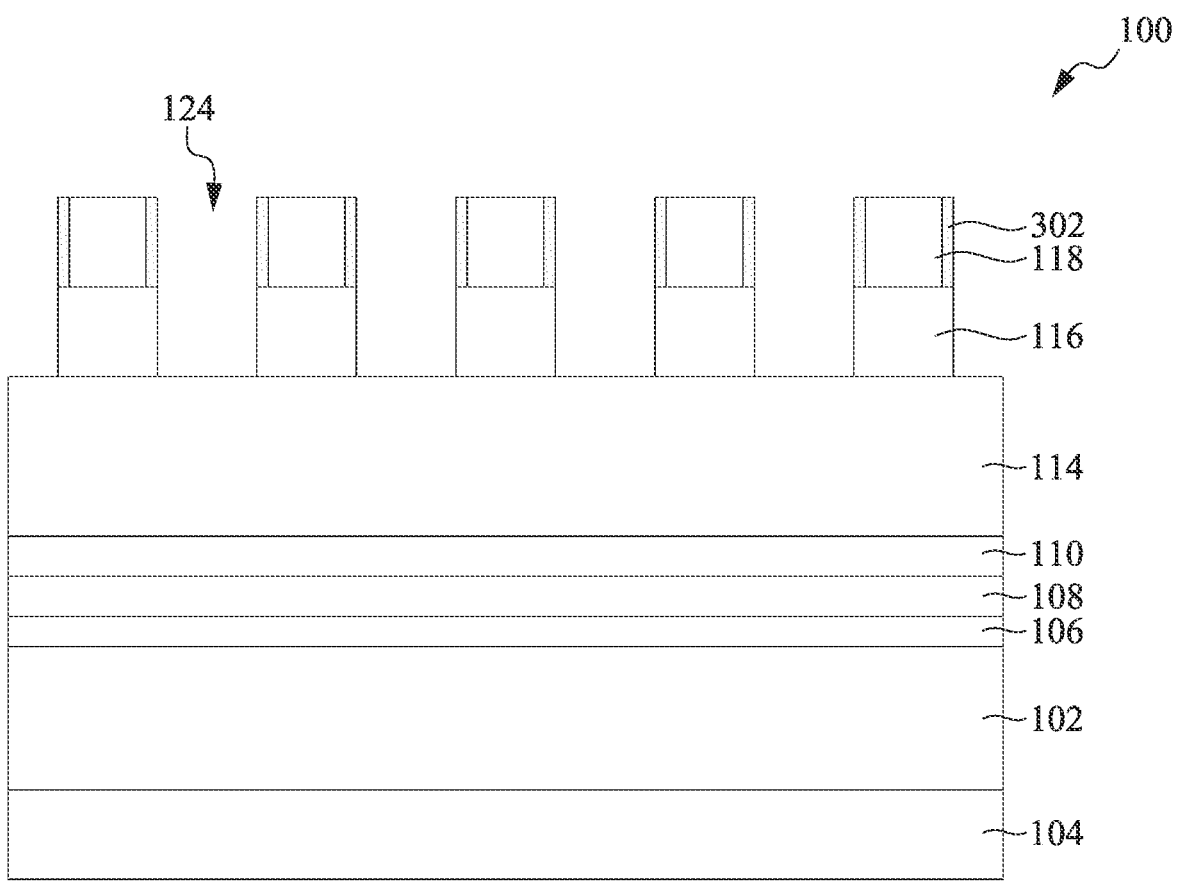

FIG. 12 follows from FIG. 11 and illustrates the transferring of the pattern of the upper layer 118 to the middle layer 116 in an etching process. The etching process is anisotropic, such as a reactive ion etching (RIE) process, so that the openings 124 are extended through the middle layer 116 and have about the same sizes in the middle layer 116 as they do in the overlying layer, in accordance with some embodiments. In some embodiments, the thinning of the film 302 and the transferring of the pattern of the upper layer 118 to the middle layer 116 are performed by the same etching process or a separate etching process. The remaining portions of the film 302 on the top surfaces of the upper layer 118 increase the effective height of the upper layer 118 during the etching process. The higher effective height of the upper layer 118 may increase the etch selectivity of the upper layer 118 with the middle layer 116. This can lead to a transfer of the pattern of the upper layer 118 to the middle layer 116 with fewer defects and to subsequent transfers of the pattern to lower layers (see above, FIGS. 5-7) with fewer defect, which can lead to a reduction in line width roughness (LWR) of subsequently formed conductive features in the target layer 102 (see above, FIGS. 8-9), such as metal lines. The etching process may remove portions of the film 302 on top surfaces of the upper layer 118. In some embodiments, portions of the film 302 remain on sidewalls of the upper layer 118 after the etching process, and the patterned portions of the middle layer 116 have larger widths than the patterned portions of the upper layer 118. The remaining portions of the film 302 may be removed in a subsequent etching process of the bottom layer 114 (see FIG. 5, above).

After the transferring of the pattern of the upper layer 118 to the middle layer 116, subsequent processing steps may proceed as described above in respect to FIGS. 5-9. Due to the film 302 protecting the profile of the upper layer 118, the pattern of the upper layer 118 may be transferred through intermediate layers (e.g. the middle layer 116, the bottom layer 114, the dielectric layer 110, the hard mask 108, and the ARC 106) to the target layer 102 with reduced defects, which may lead to conductive features formed in the target layer 102 having reduced LWR. The resulting smoother line profiles may improve device performance, such as by decreasing sheet resistance.

By employing the embodiments discussed herein, conductive lines having spacing of 50 nm or less may be reliably formed with fewer manufacturing defects and increased yield in a single patterning process. In other embodiments where the target layer 102 is a conductive layer or a semiconductor layer, a reverse pattern of the hard mask layer 108 (see above, FIG. 6) may be patterned in the target layer 102 using a similar process as described above with respect to FIG. 7. For example, an additional hard mask (not shown) may be deposited around the hard mask layer 108. The hard mask layer 108 is then removed, and the additional hard mask is used to pattern the target layer 102. The resulting patterned target layer 102 has a negative pattern than the pattern of the hard mask 108.

Embodiments may achieve advantages. Treating a patterned photoresist with a treatment process (e.g., a plasma treatment) or forming a film over the patterned photoresist can protect the profile of the patterned photoresist during a subsequent etching process. The protected profile of the patterned photoresist layer may lead to a transfer of the pattern of the patterned photoresist to lower layers with reduced defects, which may reduce line width roughness (LWR) of subsequently formed conductive features in a target layer, such as metal lines. Device performance can be improved by the decrease in sheet resistance provided by smoother profiles of the conductive features formed in the target layer.

In accordance with an embodiment, a method of forming a semiconductor device includes: patterning a photoresist layer on a mask layer; performing an oxygen plasma treatment on the photoresist layer, the oxygen plasma treatment converting the photoresist layer to a treated photoresist layer by oxidizing an exposed surface of the photoresist layer; patterning the mask layer using the treated photoresist layer as a mask; and patterning a target layer using the patterned mask layer as a mask. In an embodiment, the oxygen plasma treatment is performed at a temperature less than 200° C. In an embodiment, the oxygen plasma treatment is performed for a duration in a range of 1 second to 10 seconds. In an embodiment, the photoresist layer includes carbon. In an embodiment, the method further includes performing a de-scum process on the semiconductor device after patterning the photoresist layer. In an embodiment, the de-scum process is performed before performing the oxygen plasma treatment on the photoresist layer. In an embodiment, the de-scum process is performed after performing the oxygen plasma treatment on the photoresist layer.

In accordance with another embodiment, a method of forming a semiconductor device includes: forming a film over a patterned top layer, the patterned top layer being on a mask layer, the mask layer being over a target layer, wherein openings extend through the patterned top layer to expose the mask layer, a first portion of the film over the patterned top layer has a first thickness, a second portion of the film on a bottom surface of the openings has a second thickness, and the first thickness is greater than the second thickness; patterning the mask layer using the patterned top layer as a mask; and using the patterned mask layer as a mask to pattern the target layer. In an embodiment, the film is silicon oxide, silicon oxycarbide, or silicon oxycarbonitride. In an embodiment, forming the film includes a plasma enhanced atomic layer deposition process. In an embodiment, the method further includes performing a thinning process on the film before patterning the mask layer. In an embodiment, the film has a thickness in a range of 3 Å to 30 Å over a top surface of the patterned top layer before the thinning process. In an embodiment, the film has a thickness in a range of 0.1 Å to 12.5 Å over a top surface of the patterned top layer after the thinning process. In an embodiment, the mask layer includes a film stack over the target layer and a photoresist over the film stack.

In accordance with yet another embodiment, a method of forming a semiconductor device includes: forming a film stack over a target layer, the target layer being on a substrate; forming a photoresist over the film stack, the photoresist including a bottom layer, a middle layer over the bottom layer, and a top layer over the middle layer; patterning the top layer; forming an oxide layer on exposed surfaces of the patterned top layer; patterning the middle layer using the patterned top layer as a mask; patterning the bottom layer using the patterned middle layer as a mask; patterning the film stack using the patterned bottom layer as a mask; patterning the target layer using the patterned film stack as a mask to form openings through the target layer; and forming conductive features in the openings. In an embodiment, forming the oxide layer includes an $O_2$ plasma process. In an embodiment, forming the oxide layer includes depositing an oxide film over the patterned top layer. In an embodiment, the oxide film includes silicon and carbon. In an embodiment, the film stack includes an anti-reflective coating, a hard mask over the anti-reflective coating, and a dielectric layer over the hard mask. In an embodiment, the method further includes forming a liner in the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   patterning a photoresist layer on a mask layer;
   performing an oxygen plasma treatment on the photoresist layer, the oxygen plasma treatment converting the photoresist layer to a treated photoresist layer by oxidizing an exposed surface of the photoresist layer;
   after the performing the oxygen plasma treatment patterning the mask layer using the treated photoresist layer as a mask, wherein during an etching of the mask layer the treated photoresist layer is an oxidized organic material; and
   patterning a target layer using the patterned mask layer as a mask.

2. The method of claim 1, wherein the oxygen plasma treatment is performed at a temperature less than 200° C.

3. The method of claim 1, wherein the oxygen plasma treatment is performed for a duration in a range of 1 second to 10 seconds.

4. The method of claim 1, wherein the photoresist layer comprises carbon.

5. The method of claim 1, further comprising performing a de-scum process on the semiconductor device after patterning the photoresist layer.

6. The method of claim 5, wherein the de-scum process is performed before performing the oxygen plasma treatment on the photoresist layer.

7. The method of claim 5, wherein the de-scum process is performed after performing the oxygen plasma treatment on the photoresist layer.

8. A method of forming a semiconductor device, the method comprising:
   forming a film over a patterned top layer, the patterned top layer being on a mask layer, the mask layer being over a target layer, wherein openings extend through the patterned top layer to expose the mask layer, a first portion of the film over the patterned top layer has a first thickness, a second portion of the film on a bottom surface of the openings has a second thickness, and the first thickness is greater than the second thickness;
   patterning the mask layer using the patterned top layer as a mask; and
   using the patterned mask layer as a mask to pattern the target layer.

9. The method of claim 8, wherein the film is silicon oxide, silicon oxycarbide, or silicon oxycarbonitride.

10. The method of claim 8, wherein forming the film comprises a plasma enhanced atomic layer deposition process.

11. The method of claim 8, further comprising performing a thinning process on the film before patterning the mask layer.

12. The method of claim 11, wherein the film has a thickness in a range of 3 Å to 30 Å over a top surface of the patterned top layer before the thinning process.

13. The method of claim 11, wherein the film has a thickness in a range of 0.1 Å to 12.5 Å over a top surface of the patterned top layer after the thinning process.

14. The method of claim 8, wherein the mask layer comprises a film stack over the target layer and a photoresist over the film stack.

15. A method of forming a semiconductor device, the method comprising:
   forming a film stack over a target layer, the target layer being on a substrate;
   forming a photoresist over the film stack, the photoresist comprising a bottom layer, a middle layer over the bottom layer, and a top layer over the middle layer;
   patterning the top layer, wherein the patterning the top layer forms first openings through the patterned top layer;
   forming an oxide layer on exposed surfaces of the patterned top layer and over bottom surfaces of the first openings, wherein the oxide layer has a first thickness on the exposed surfaces of the patterned top layer and a second thickness over the bottom surfaces of the first openings, wherein the first thickness is greater than the second thickness;

patterning the middle layer using the patterned top layer as a mask;

patterning the bottom layer using the patterned middle layer as a mask;

patterning the film stack using the patterned bottom layer as a mask;

patterning the target layer using the patterned film stack as a mask to form second openings through the target layer; and forming conductive features in the second openings.

16. The method of claim 15, wherein forming the oxide layer comprises an $O_2$ plasma process.

17. The method of claim 15, wherein forming the oxide layer comprises depositing an oxide film over the patterned top layer.

18. The method of claim 17, wherein the oxide film comprises silicon and carbon.

19. The method of claim 15, wherein the film stack comprises an anti-reflective coating, a hard mask over the anti-reflective coating, and a dielectric layer over the hard mask.

20. The method of claim 15, further comprising forming a liner in the second openings.

* * * * *